United States Patent [19]

Abe et al.

[11] Patent Number: 4,636,832

[45] Date of Patent: Jan. 13, 1987

[54] SEMICONDUCTOR DEVICE WITH AN IMPROVED BONDING SECTION

[75] Inventors: Masahiro Abe, Yokohama; Masaharu Aoyama, Fujisawa; Takashi Ajima, Kamakura; Toshio Yonezawa, Yokosuka, all of Japan

[73] Assignee: Tokyo Shibaura Denki Kabushiki Kaisha, Kawasaki, Japan

[21] Appl. No.: 837,663

[22] Filed: Mar. 4, 1986

Related U.S. Application Data

[63] Continuation of Ser. No. 517,412, Jul. 26, 1983, abandoned.

[30] Foreign Application Priority Data

Jul. 27, 1982 [JP] Japan ................................ 57-129563

[51] Int. Cl.[4] ...................... H01L 23/14; H01L 21/60
[52] U.S. Cl. ......................................... 357/68; 357/71; 357/59
[58] Field of Search ....................... 357/71, 67, 59, 54, 357/2, 65, 68

[56] References Cited

U.S. PATENT DOCUMENTS

| | | | |
|---|---|---|---|
| 3,519,901 | 5/1970 | Bean et al. | 357/59 |
| 3,667,008 | 5/1972 | Katnack | 357/59 |
| 4,005,455 | 1/1977 | Watrous, Jr. et al. | 357/59 |
| 4,258,382 | 3/1981 | Harris . | |
| 4,288,256 | 9/1981 | Ning et al. | 357/54 |
| 4,291,222 | 9/1981 | Clemens et al. | 357/71 |
| 4,291,322 | 9/1981 | Clemens et al. | 357/71 |

FOREIGN PATENT DOCUMENTS

57-155740  9/1982  Japan .

OTHER PUBLICATIONS

International Electron Devices Meeting, Technical Digest, Dec. 7th–9th, 1981, pp. 62–65, "A New Integration Technology that Enables Forming Bonding Pads on Active Areas".

"Aluminum–Silicon Conductor Formation"–Leff, IBM Technical Disclosure Bulletin, vol. 12, No. 11, Apr. 1970, p. 1996.

"Aluminum–Copper–Silicon Semiconductor Metallurgy"–Conrad, vol. 13, No. 12, May, 1971, IBM Technical Disclosure Bulletin, p. 3661.

Primary Examiner—William D. Larkins
Assistant Examiner—S. V. Clark
Attorney, Agent, or Firm—Finnegan, Henderson, Farabow, Garrett & Dunner

[57] ABSTRACT

A semiconductor device with a bonding section comprising a semiconductor substrate, a silicon layer formed on the semiconductor substrate with a first insulating layer interposed therebetween, and a bonding pad formed on the silicon layer with a second insulating layer interposed therebetween. The silicon layer has substantially the same size as the bonding pad. When a lead line is bonded to the bonding pad, the silicon layer lessens the stress caused by the bonding.

4 Claims, 5 Drawing Figures

F I G. 4
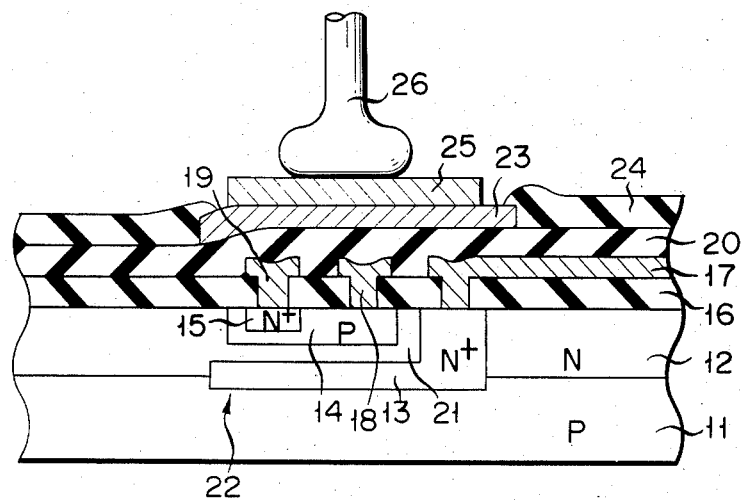
F I G. 5
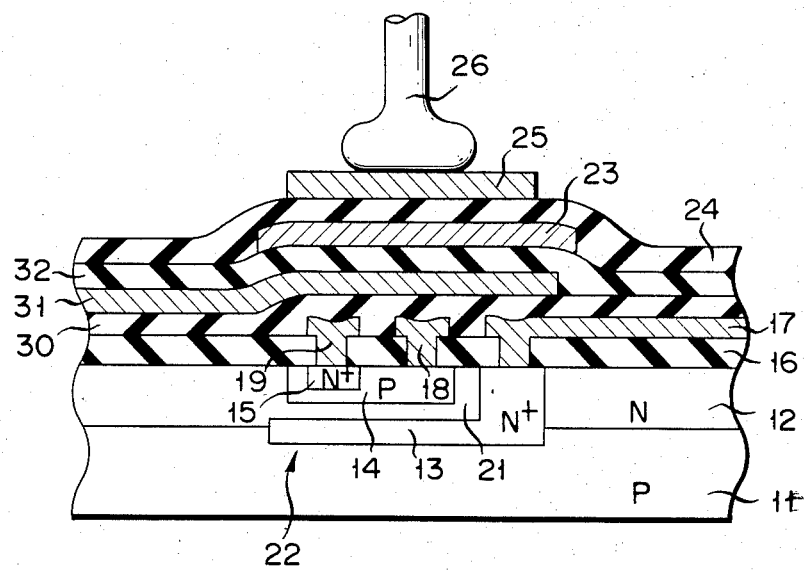

SEMICONDUCTOR DEVICE WITH AN IMPROVED BONDING SECTION

This application is a continuation of Ser. No. 517,412 filed July 26, 1983, abandoned Apr. 23, 1986.

BACKGROUND OF THE INVENTION

The present invention relates to a semiconductor device, and more particularly, to a semiconductor device with an improved bonding section.

A conventional bonding section formed on a main surface of a semiconductor chip is shown in FIG. 1. An epitaxial layer 2 of N type is formed in a semiconductor substrate 1 of P type. An insulating layer 3 made of $SiO_2$ approx. 1.0 $\mu$ thick is formed on the p-type semiconductor substrate 1. On the insulating layer 3 a bonding pad 4 made of aluminum approx 1.0 $\mu$ thick is formed, and this is further bonded to a bonding wire 5 made of gold. An N-type epitaxial layer 2a under the bonding pad 4 is electrically insulated from the other N-type epitaxial layers 2 by a $p^+$-type diffusion region 6 shaped like a ring. The diffusion region 6 is provided for preventing the flow of a leak current which might be generated if the insulating layer 3 were cracked by an impact at the time of bonding.

The conventional semiconductor device thus structured involves the following problems. First, it is impossible to form semiconductor elements, for example, transistors, diodes, resistors, etc., and interconnections, on the N-type epitaxial layer 2a under the bonding pad 4. The reason for this is that, with the impact at the time of bonding, the semiconductor elements may be destroyed or the interconnection may be broken. In particular, when an Al alloy containing Cu is used for the bonding pad, a large urging force is required, resulting in a great impact being delivered to the semiconductor substrate. Since an area of the semiconductor pad is generally 10,000 $\mu^2$, this leads to an ineffective utilization of the area of the semiconductor chip.

As shown in FIG. 1, the provision of the $P^+$-type diffusion region 6 is necessary to electrically insulate the N-type epitaxial layer 2a under the bonding pad 4. The width of the $p^+$-type diffusion region 6 must be at least 10 $\mu$. The provision of the $P^+$-type diffusion region 6 also hinders the miniaturization of the semiconductor devices.

Further, the adverse effects of the bonding upon the semiconductor device during the course of its manufacture extend to semiconductor regions other than those under the bonding pad 4. As a result, the PN junction is damaged, leading to generation of the leak current. The counter-measures conventionally taken to solve this leak current problem are not satisfactory.

SUMMARY OF THE INVENTION

Accordingly, an object of the present invention is to provide a semiconductor device with an improved bonding section which will lessen the impact which may occur in the bonding work and will prevent the generation of a leak current.

This and other objects have been attained by the semiconductor device with a bonding section comprising: a semiconductor substrate, a silicon layer formed on the semiconductor substrate with a first insulating layer interposed therebetween, and a bonding pad formed on the silicon layer with a second insulating layer interposed therebetween, the size, (surface area), of the silicon layer being substantially equal to that of the bonding pad, whereby, when a lead line is bonded to the bonding pad, the silicon layer lessens the stress caused by the bonding.

With such an arrangement, the impact produced in the bonding work is lessened, and so semiconductor elements can be formed in the semiconductor substrate under the bonding pad. This is an improvement in the efficient use of the semiconductor chip. Unlike the conventional semiconductor device, there is no need for a diffusion region for electric insulation. This further enhances the utilization efficiency of the semiconductor chip area. In conventional semiconductor devices, it is a common practice to dispose the bonding pad around the chip. However, according to this invention the bonding pad is not necessarily disposed around the chip.

BRIEF DESCRIPTION OF THE DRAWINGS

Other objects and advantages will be apparent from the following description taken in connection with the accompanying drawings, in which:

FIGS. 4 and 5 show cross-sectional views illustrating another embodiment according to the present invention.

DETAILED DESCRIPTION OF THE PREFERRED EMBODIMENTS

Figure 1:
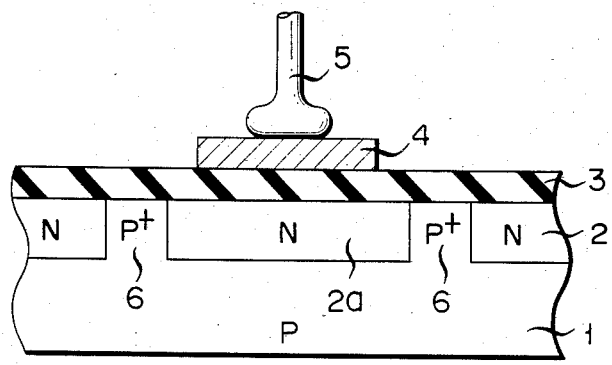
FIG. 1 shows a cross-sectional view of a bonding pad section of a conventional semiconductor device.
Figure 2:
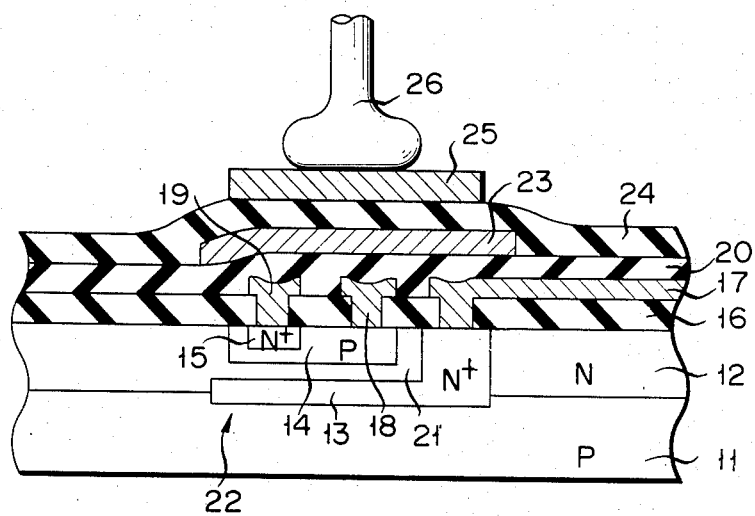
FIG. 2 shows a cross-sectional view of a bonding pad section of a first embodiment of a semiconductor device according to the present invention.

An embodiment of a semiconductor device according to this invention will be described referring to FIG. 2. An N-type epitaxial layer 12 is formed on a P-type semiconductor substrate 11. An N-type buried layer 13 and a P-type base region 14 are formed in the N-type epitaxial layer 12. The N-type epitaxial layer 12 and the N-type buried layer 13 together serve as a collector region 21. An $N^+$-type emitter region 15 is formed in the P-type base region 14. An $SiO_2$ layer 16 with a 0.6 $\mu$ thickness is formed over the N-type epitaxial layer 12, the $N^+$-type buried layer 13, the P-type base region 14 and the N-type emitter region 15. A collector electrode 17, a base electrode 18 and an emitter electrode 19 are formed of aluminum films with a 1.0 $\mu$ thickness. A PSG (Phospho-Silicate Glass) layer 20 which is 0.6 $\mu$ thick is formed on the collector electrode 17, the base electrode 18, the emitter electrode 19, and the $SiO_2$ layer 16. A polycrystalline silicon layer 23 which is 0.4 $\mu$ thick is provided on the portion of the PSG layer 20 which lies above a transistor 22 formed of the N-type emitter region 15, the P-type base region 14 and the collector region 21. Over a polycrystalline silicon layer 23 and a PSG layer 20 a 0.3 $\mu$ thick $SiO_2$ layer 24 is formed. An aluminum bonding pad 25 with an area of 80 $\mu^2$ to 100 $\mu^2$ and 1.0 $\mu$ thick is layered on the polycrystalline silicon layer 23 with the $SiO_2$ layer 24 interposed therebetween. A gold bonding wire 26 with a 25 $\mu$ diameter is bonded on the bonding pad 25. In the bonding, a ball formed at the end of a bonding wire 26 is heated to 325° C., and is then pressed to the bonding pad 25 with a pressure of 40 g to 60 g. This process ensures a strong bond.

The polycrystalline silicon layer 23 can be formed by growing polycrystalline silicon at low temperature by the plasma CVD method. The reason why the low temperature growing process is employed here is that the high temperature growing process, if employed, would have adverse effects on the semiconductor elements and interconnection wiring layers, which have already be formed. The conditions for the plasma CVD are: a temperature of 380° C., pressure of $1 \times 10^{-2}$ Pa, a SiH$_4$ gas, and a plasma output of 200 W. The PSG layer 20 is formed by the normal pressure CVD method, with the concentration of phosphor being $1 \times 10^{21}$ atm/cm$^3$.

Figure 3:
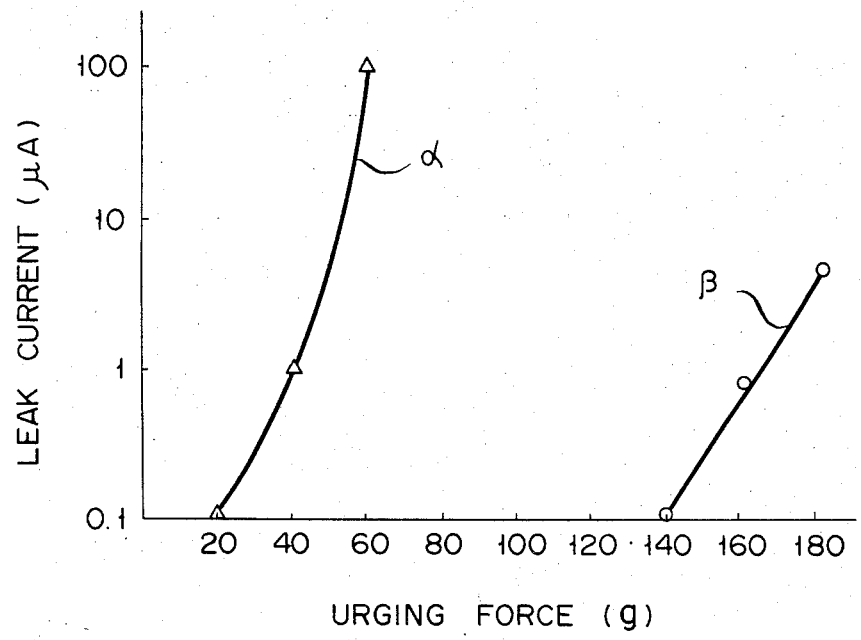
FIG. 3 shows a graphic representation illustrating changes of the leak current against the urging force in the bonding sections of the semiconductor device of FIG. 2 and a conventional semiconductor device.

With such an arrangement, the SiO$_2$ layer with a tensile strength of 4 Kg/mm$^2$ is reinforced by the polycrystalline silicon layer with a tensile strength of 7 to 35 Kg/mm$^2$. This feature prevents the SiO$_2$ layer from cracking. FIG. 3 is a graphic representation of changes in the leak current against the urging force in the bonding section of the semiconductor device of FIG. 2 and in that of the conventional semiconductor device. For this graph, NPN transistors were formed under the bonding sections and the leak current was measured between the emitter and the base of the transistor. In the graph, a curve α represents a characteristic in the bonding section of the prior art, and a curve β represents that in the bonding section of the present invention. As seen from the graph, the impact delivered to the SiO$_2$ layer and the semiconductor substrate increases with the increase of the urging force of the gold ball against the bonding pad. The increased urging force damages the junctions of the NPN transistor. In the conventional semiconductor device having no polycrystalline silicon layer 23, a leak current of 1 μA is produced with the urging force of 40 g. For obtaining good bonding, the urging force must be set at 40 g to 70 g. For the above reason, in the prior semiconductor device, it is impossible to form the semiconductor element under the bonding pad.

On the other hand, in the present invention, since the polycrystalline silicon layer 23 is provided, the leak current is 1 μA for 160 g of urging force. Accordingly, the formation of the semiconductor element under the bonding pad is made possible, thus improving the utilization efficiency of the chip area. In other words, since the bonding pad may be formed on the semiconductor element, it is possible to place the bonding pad anywhere on the chip.

A second embodiment of the present invention will be described referring to FIG. 4. When silicon-contained aluminum is used for the bonding pad 25, the polycrystalline silicon layer 23 can be directly covered with the bonding pad 25. The remaining portions in this embodiment are substantially the same as in the first embodiment. Hence, no further explanation will be given, and like reference symbols will be used for like portions in FIG. 2.

A third embodiment of the invention will be described referring to FIG. 5. In this embodiment, an aluminum interconnection wire 31 which is 1μ thick is formed on an NPN transistor 22 formed in the semiconductor substrate 11, with an SiO$_2$ film 30 of 1μ thickness interposed therebetween. Further, the polycrystalline silicon layer 23 is formed on the aluminum interconnection wire 31, with an SiO$_2$ film 32 intervening therebetween. The remaining portion of this embodiment is substantially the same as that of the FIG. 2 embodiment and futher description of it will thus be omitted. Also in the semiconductor device with a multi-layered structure in which the aluminum interconnection wire 31 lies on the NPN transistor 22, as in this embodiment, the provision of the polycrystalline silicon layer 23 prevents the current leakage between the aluminum interconnection wire 31 and the collector, base, and emitter electrodes 17 to 19.

It should be understood that this invention is not limited to the above-mentioned embodiments. For example, an amorphous silicon layer formed by electron beam evaporation or the Ar ion sputtering method may be used instead of the polycrystalline silicon layer 23. The SiO$_2$ layer 24 or the PSG layer 20 for electrically insulating the polycrystalline silicon layer 23 from the bonding pad 25 or the NPN transistor 22 may be replaced by a layer made of organic material such as polyimide.

What is claimed is:

1. A semiconductor device with a bonding section comprising:
   a semiconductor substrate having a plurality of semiconductor elements therein;
   a first insulating layer formed on at least one of said semiconductor elements;
   means for lessening stress during bonding including a silicon layer formed on said at least one of said semiconductor elements with said first insulating layer interposed therebetween;
   a second insulating layer formed on said silicon layer, said silicon layer being interposed between said first and second insulating layers so as to be floating; and
   a bonding pad formed on said silicon layer with said second insulating layer interposed therebetween, the surface area of said bonding pad being substantially equal to that of said silicon layer; whereby, when a lead line is bonded to said bonding pad, said silicon layer lessens stress caused by the bonding.

2. A semiconductor device with a bonding section according to claim 1, wherein said silicon layer is made of polycrystalline silicon.

3. A semiconductor device with a bonding section according to claim 1, wherein said silicon layer is made of amorphous silicon.

4. A semiconductor device with a bonding section according to claim 1, further comprising a conductive layer formed in said first insulating layer under said silicon layer.

* * * * *